US007008851B2

(12) United States Patent
Johansson et al.

(10) Patent No.: US 7,008,851 B2
(45) Date of Patent: Mar. 7, 2006

(54) SILICON-GERMANIUM MESA TRANSISTOR

(75) Inventors: Ted Johansson, Djursholm (SE); Hans Norström, Solna (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/828,712

(22) Filed: Apr. 21, 2004

(65) Prior Publication Data

US 2004/0201039 A1    Oct. 14, 2004

Related U.S. Application Data

(63) Continuation of application No. PCT/SE02/01875, filed on Oct. 15, 2002.

(30) Foreign Application Priority Data

Nov. 9, 2001    (SE) .................................... 0103726

(51) Int. Cl.
  *H01L 21/8222*    (2006.01)
(52) U.S. Cl. ....................... 438/309; 438/343; 438/353
(58) Field of Classification Search ......... 438/309–376
  See application file for complete search history.

(56) References Cited

U.S. PATENT DOCUMENTS

| 5,587,327 | A | 12/1996 | König et al. | ................ | 437/31 |
| 5,821,149 | A | 10/1998 | Schüppen et al. | ........... | 438/312 |
| 6,251,738 | B1 | 6/2001 | Huang | ....................... | 438/312 |
| 6,797,580 | B1 * | 9/2004 | Yin et al. | ................... | 438/343 |

FOREIGN PATENT DOCUMENTS

| EP | 1 139 408 A2 | 1/2001 |
| SE | 0101567-6 | 12/2002 |
| WO | WO 98/53489 | 11/1998 |
| WO | WO 01/20664 | 3/2001 |

OTHER PUBLICATIONS

A Schüppen et al., "Enhanced SiGe Heterojunction Bipolar Transistors with 160 GHz-$f_{max}$"; IEEE IEDM Tech Dig., p. 743.
A. Monroy et al., "BiCMOS6G: A high performance .035 βm SiGe BiCMOS technology for wireless applications", IEEE BCTM, p. 121.
S.A. St.Onge et al., "A 0.24 βm SiGe BiCMOS Mixed-Signal RF Production Technology Featuring a 47 GHz $f_t$ HBT and 0.18 βm $L_{eff}$ CMOS"; IEEE BCTM99, p. 117.
John D. Cressler, "SiGe HBT Technology: A New Contender for Si-Baesd RF and Microwave Circuit Applications"; IEEE Transactions on Microwave Theory and Techniques, vol. 46, No. 5.
D. Behammer, et al.; "Si/SiGe HBTs for Application in Lower Power ICs"; Solid-State Electronics, vol. 39, No. 4, pp. 471-480.

* cited by examiner

*Primary Examiner*—H. Jey Tsai
(74) *Attorney, Agent, or Firm*—Baker Botts L.L.P.

(57) ABSTRACT

A method in the fabrication of a silicon-germanium mesa transistor in a semiconductor process flow comprises the steps of providing a p-type doped silicon bulk substrate (10) having an $n_+$-type doped surface region (31) being a subcollector; depositing epitaxially thereon a silicon layer (41) comprising n-type dopant; depositing epitaxially thereon a silicon layer (174) comprising germanium and p-type dopant; forming in the epitaxial layers (41, 174) field isolation areas (81) around, in a horizontal plane, a portion of the epitaxial layers (41, 174) to simultaneously define an n-type doped collector region (41) on the subcollector (31); a p-type doped base region (174) thereon; and an n-type doped collector plug on the subcollector (31), but separated from the n-type doped collector region (41) and the p-type doped base region (174); and forming in the p-type doped base region (174) an n-type doped emitter region.

15 Claims, 2 Drawing Sheets

SILICON-GERMANIUM MESA TRANSISTOR

CROSS REFERENCE TO RELATED APPLICATION

This application is a continuation of copending International Application No. PCT/SE02/01875 filed Oct. 15, 2002 which designates the United States, and claims priority to Swedish application no. 0103726-6 filed Nov. 9, 2001.

TECHNICAL FIELD OF THE INVENTION

The present invention generally relates to the field of silicon IC-technology, and more specifically the invention relates to the formation of an SiGe mesa transistor in a semiconductor process flow, especially designed for bipolar RF-IC's; to the SiGe mesa transistor formed; and to an integrated circuit comprising such an SiGe mesa transistor.

BACKGROUND OF THE INVENTION

Advanced silicon bipolar, CMOS or BiCMOS circuits are used today for high-speed applications in the 1–5 GHz frequency range, replacing circuits previously only possible to realize using III–V based technologies. Their major application area is for modern telecommunication systems. The circuits are used mostly for analog functions, e.g. for switching currents and voltages, and for high-frequency radio functions, e.g. for mixing, amplifying, and detecting functions.

To obtain transistors well suited for e.g. telecommunication applications, not only a low transit time (high $f_T$) is needed, but also a high maximum oscillation frequency ($f_{max}$), and good linearity are required. Today's silicon bipolar junction transistors (BJT) technology can offer $f_T$ up to 50 GHz, but is reaching its physical limitations because of the trade-off between the thickness and resistivity of the base layer.

By adding some (typically 10–20%) germanium into the base of a conventional BJT, the high-frequency characteristics can be improved substantially. The new device is an SiGe (silicon germanium) HBT (heterojunction bipolar transistor) structure.

The base layer structure is usually grown with MBE (Molecular Beam Epitaxy) or CVD (Chemical Vapor Deposition), but it is also possible to implant germanium into the silicon, but with less control of the doping profile. During recent years, SiGe-based transistors have shown record high-frequency performance with regards to $f_T$ and $f_{max}$ (maximum oscillation frequency), see "Enhanced SiGe Heterojunction Bipolar Transistors with 160 GHz-$f_{max}$" by A. Schüppen et al., IEEE IEDM Tech Dig., p. 743, 1995. For "high-frequency applications, e.g. wireless communication, the SiGe HBT can be used to boost performance of existing double-polysilicon RF-ICs and BiCMOS technologies. An extensive review of SiGe epitaxial base technology is given in "SiGe HBT Technology: A New Contender for Si-Based RF and Microwave Circuit Applications" by J. D. Cressler, IEEE TED-46, p. 572, May 1998.

SiGe can be added into existing IC-process flows in different ways. Some typical examples of extending a BiCMOS process with SiGe-base transistors can be found in "BiCMOS6G: A high performance 0.35 $\mu$m SiGe BiCMOS technology for wireless applications" by A. Monroy et al., IEEE BCTM 1999, p. 121 and in "A 0.24 $\mu$m SiGe BiCMOS Mixed-Signal RF Production Technology Featuring a 47 GHz $F_T$ HBT and 0.18 $\mu$m $L_{eff}$ CMOS" by S. A. St. Onge et al., IEEE BCTM99, p. 117, 1999.

A simpler, yet feasible method to fabricate high-performance SiGe HBT transistor, is by using epitaxial deposition of the device layers, and then form the device structure by mesa transistor etching, similar to fabrication of compound semiconductor devices (e.g. GaAlAs HBTs). The mesa structures have been widely used to quickly verify concepts and explore device characteristics because of its simplicity and ease of fabrication, see "Si/SiGe HBTs for Applications in Lower Power ICs" by D. Behammer et al., Solid-State Electronics, Vol. 39, No. 4, p. 471, 1996.

IC-type of circuits generally require more complicated structures than a few transistors, and the mesa concept, discussed in the previous section, is generally not suitable for this. With refined fabrication schemes, such as described in U.S. Pat. No. 5,587,327 to U. König et al. and in U.S. Pat. No. 5,821,149 to A. Schüppen et al., some of the drawbacks can be circumvented. However, a few critical process steps still remain, such as the differential epitaxy (simultaneous epitaxial growth on silicon substrate openings, and deposition of non-epitaxial material on field areas and other structures), and the critical removal of the part of the emitter layer on the extrinsic base areas, which make the concept less feasible for high-volume semiconductor production.

A simpler method to realize and integrate a mesa-type of SiGe HBT transistor into a semiconductor process flow suitable for high-volume production is therefore needed.

SUMMARY OF THE INVENTION

Accordingly, it is an object of the present invention to provide a method for integration of a mesa-type of SiGe transistor structure into a conventional process flow, such as a silicon bipolar double-polysilicon process flow.

It is a further object of the invention to provide such a method, wherein the epitaxial growth of the mesa layer is simple and easy.

It is a further object of the invention to provide such a method, which requires a minimum of process steps.

To this end the present invention comprises according to a first aspect a method in the fabrication of a silicon-germanium mesa transistor in a semiconductor process flow, particularly in a process flow designed for a bipolar integrated circuit for radio frequency applications, comprising the steps of:

providing a p-type doped silicon bulk substrate having an n+ type doped subcollector region for the mesa transistor in a surface thereof;

depositing epitaxially on the n+-type doped subcollector region a silicon layer comprising n-type dopant;

depositing epitaxially thereon a silicon layer comprising germanium and p-type dopant;

forming in the epitaxial layers field isolation areas, preferably shallow trenches, around, in a horizontal plane, a portion of the epitaxial layers to simultaneously define, preferably by means of etching, an n-type doped collector region on the subcollector; a p-type doped mesa base region on the collector region; and an n-type doped collector plug on the subcollector, but separated from the n-type doped collector region and the p-type doped base region; and forming in the p-type doped base region an n-type doped emitter region for the mesa transistor.

Preferably, the silicon layer comprising germanium and p-type dopant is provided as a multilayer structure including a plurality of layers in a stack. Some of the layers may include intrinsic silicon only.

Carbon may be added to the silicon layer comprising germanium and p-type dopant to retard diffusion of the p-type dopant.

The temperature budget shall during the fabrication of the silicon-germanium mesa transistor be kept at a minimum. Preferably, temperatures are kept below or at about 800° C. subsequent to the deposition of the silicon layer comprising germanium and p-type dopant apart possibly from a step of emitter activation and drive-in. Such emitter activation and drive-in step may be performed at a higher temperature using an RTA (Rapid Thermal Anneal) to electrically activate dopants, and to set the final doping profiles of the emitter-base junction of the SiGe mesa transistor. Typically, the emitter activation and drive-in step is performed at high temperature, e.g. at about 1050° C., but during a short time of about 5–20 seconds.

Further, the present invention includes according to a second aspect an SiGe mesa transistor fabricated in accordance with the first aspect of the invention.

Still further, the present invention includes according to a third aspect an integrated circuit comprising at least one of the SiGe mesa transistor according to the second aspect of the invention.

The deposition of the base layer is made blanket on a wafer with a plain silicon upper layer, which provides for a simpler epitaxial growth with less requirements than prior art techniques.

The formation of field isolation areas around, in a horizontal plane, a portion of the epitaxial layers (base and n-well), preferably by means of STI (shallow trench isolation) etching, simultaneously defines the collector region; the mesa base region; and the collector plug of the SiGe mesa transistor. Preferably, the STI etching is performed down to the subcollector.

Using a conventional RF-IC bipolar process flow with shallow trench isolation, the SiGe epitaxial layer for the base is deposited directly after the intrinsic epitaxial layer for the collector. The etching of the shallow trenches simultaneously forms the mesa transistor structure without further additional steps.

Further characteristics of the invention and advantages thereof will be evident from the detailed description of preferred embodiments of the present invention given hereinafter and the accompanying FIGS. 1–4, which are given by way of illustration only, and thus are not limitative of the present invention.

DETAILED DESCRIPTION OF EMBODIMENTS

Figure 1:
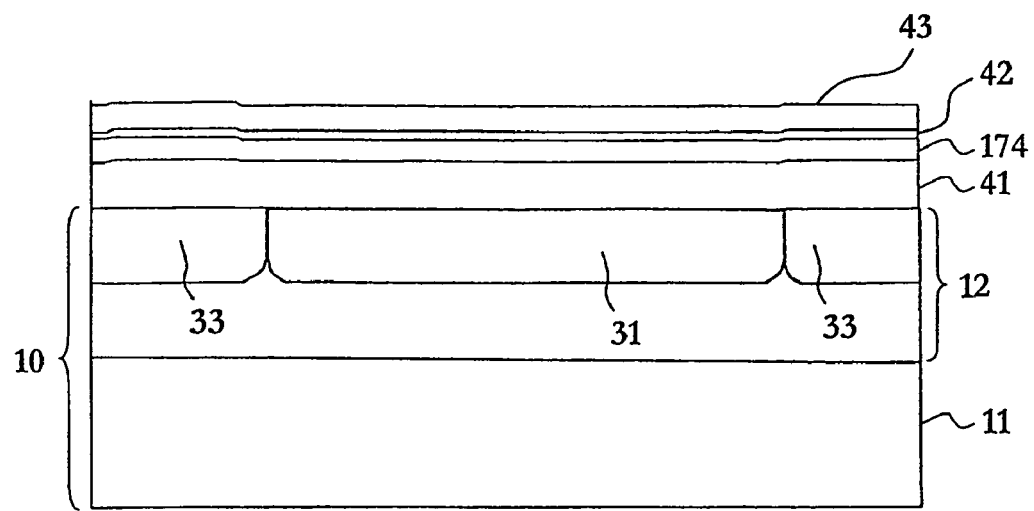
FIGS. 1–4 are highly enlarged cross-sectional views of a portion of a semiconductor structure during processing according to a preferred embodiment of the present invention.

A preferred method of manufacturing an SiGe mesa transistor is overviewed below with reference to FIGS. 1–4.

A substrate 10 consisting of a highly $p^+$-doped wafer 11 is provided, on which a low-doped silicon layer 12 of p-type is grown. Alternatively, the p-type wafer can be a homogeneously low-doped p-type wafer (not illustrated).

In layer 12 buried n-doped 31 and p-doped 33 regions are formed by means of (i) forming a thin protective layer of silicon dioxide on the layer 12; (ii) forming a mask thereon by photolithographic methods to define an area for the SiGe mesa transistor; (iii) $n^+$-type doping the areas defined by the mask, (iv) removing the mask; (v) heat treating the structure obtained; (vi) optionally p-type doping the structure; and (vii) exposing the upper surfaces of regions 31 and 33. The region 31 is also referred to as a buried $n^+$-doped subcollector.

Thereafter, an epitaxial silicon layer 41, preferably 0.6–0.7 μm thick, is grown on the surface, which layer is doped in selected regions to obtain regions of n-and p-type (n-wells and p-wells). The layer is preferable deposited by RP-CVD (reduced pressure chemical vapor deposition) using silane or dichlorosilane. In FIG. 1 the complete layer 41 is n-type doped.

The process now continues according to the present invention with deposition of another epitaxial layer 174, which will form the base of the SiGe mesa transistor.

In the simplest version a silicon-germanium layer is epitaxially deposited and doped with p-type dopant. However, in a preferred version an Si/SiGe/Si-profile, as described by Table 1 below, is applied. It consists of a multilayer stack as listed in Table 1 in order of deposition.

The base structure can be deposited using a variety of methods: RP-CVD, UHV-CVD or MBE. In each case, the base multilayer 174 is best grown in one deposition sequence or run.

It shall be appreciated that the base layer 174 may comprise fewer or more than five layers with other thicknesses and compositions as long as the silicon-based multilayer 174 comprises germanium and p-type dopant. The germanium and the p-type dopant may be added during the epitaxial growth, but one of them or both may alternatively be added subsequent to the epitaxial growth of a pure silicon layer.

TABLE 1

Deposited layers for the base structure, in order of deposition (layer 1 being closest to the collector, layer 5 being the top surface layer). In the Table Angstrom values indicate the thickness of respective layer, i-Si denotes undoped (intrinsic) silicon, percentage values indicate mean germanium concentration in atomic percentages ($Si_{1-x}Ge_x$), and B indicates base doping with boron concentration given in $cm^{-3}$. For the third layer a graded profile is achieved having a germanium content that varies from 12 to 0% from bottom to top.

| Layer # | Material |
|---|---|
| 1 | 200 Å i-Si |
| 2 | 400 Å i-SiGe, 12% |
| 3 | 250 Å SiGe, 12-0%, B 5E18 |
| 4 | 250 Å Si, B 5E18 |
| 5 | 400 Å i-Si |

When using RP-CVD, the layers 41 and 174 may be grown in one deposition sequence using the same deposition equipment.

In the remaining fabrication process it is essential to keep a strict temperature budget, i.e. the combination of time and temperature, as otherwise the sharp boron doping profile in the base may widen by way of thermally activated diffusion, and the high-frequency properties (e.g. $f_T$) of the resulting SiGe mesa transistor will degrade. Therefore, at all possible steps, thermal oxidation will be done at temperatures in the low range of what is commonly used for this kind of process steps, preferably not higher than about 800° C.

As a further precaution to avoid base widening, carbon can be added into the base layer 174 during or subsequent to the epitaxial deposition thereof. Such provisions will retard the boron diffusion and maintain a narrow doping profile after heat treatments. For further details regarding this, reference is made to DE 19652423 (B. Heinemann, G. Lippert, and H. Osten, 1998), which publication hereby is incorporated by reference.

The thickness of the layer 174 is in the example shown in Table 1 1500 Å. In following etching and doping steps this has to be accounted for, and thus implantation energies and etching depths have to be slightly increased compared to a conventional fabrication process; where no base layer 174 is added at this point in the process. Reference is here made to Swedish patent application No. 0101567-6, which is hereby incorporated by reference. However, the thickness of the base layer 174 is so small that any changes of implantation energies and etching depths may not be necessary.

In order to define active regions in the layers 41 and 174 and to isolate these regions shallow trenches are formed. Firstly, an oxide layer 42 is formed on top of the base layer 174 and a silicon nitride layer 43 is deposited thereon. The resulting structure is shown in FIG. 1.

A hard mask is then formed by the steps of patterning and etching away the silicon nitride 43 and oxide 42 layers at areas where the trenches are to be formed. The shallow trenches are then defined by etching the structure using remaining portions of the layers 42 and 43 as hard mask. Simultaneously, an n-type doped collector region (n-well) 41 on top of the subcollector 31; a p-type doped base region 174 for the SiGe mesa transistor thereon; and an n-type doped collector plug 41 on the subcollector 31, but separated from the n-type doped collector region 41 and the p-type doped base region 174 by the shallow trenches, are defined.

The shallow trenches are later in the process flow filled with oxide 81, see e.g. FIG. 3.

It shall be appreciated that the shallow trenches can be formed such that they extend vertically from the upper silicon surface, i.e. the upper surface of layer 174, and down into the subcollector 31 (not illustrated in FIGS. 1–4).

Next, deep trenches are to be formed around the SiGe mesa transistor for component isolation. The formation of deep trenches is, however, optional.

Figure 2:
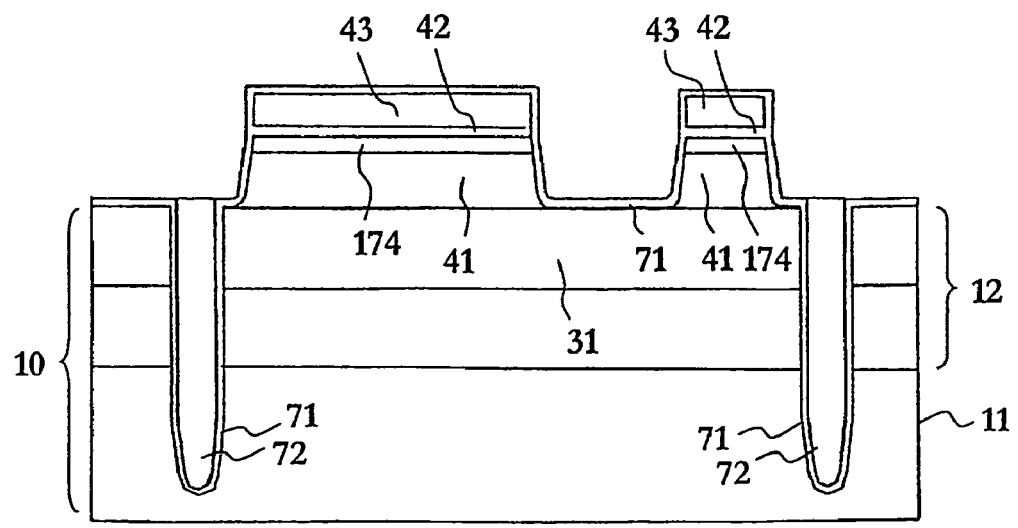

The deep trenches are formed by the steps of (i) forming a hard mask for the deep trenches by depositing a silicon dioxide layer; and patterning and etching this silicon dioxide layer to define openings for the deep trenches; (ii) etching the deep trenches; (iii) removing the remaining portions of the oxide layer; (iv) growing a thin oxide on top of the structure; (v) filling the deep trenches with deposited oxide (the thin grown oxide and the deposited oxide being together denoted by 71) and polysilicon 72; (vi) optionally planarizing the polysilicon; and (vii) etching back the structure to remove all polysilicon from the shallow trench areas. The resulting structure is shown in FIG. 2.

Subsequently thereto, the shallow trenches are filled with oxide 81, and the nitride 43 and oxide 42 layers are removed, and so is the deposited oxide on top of the nitride layer 43.

The isolation scheme is further described in the international patent application publication WO 0120664, which is hereby incorporated by reference.

Figure 3:
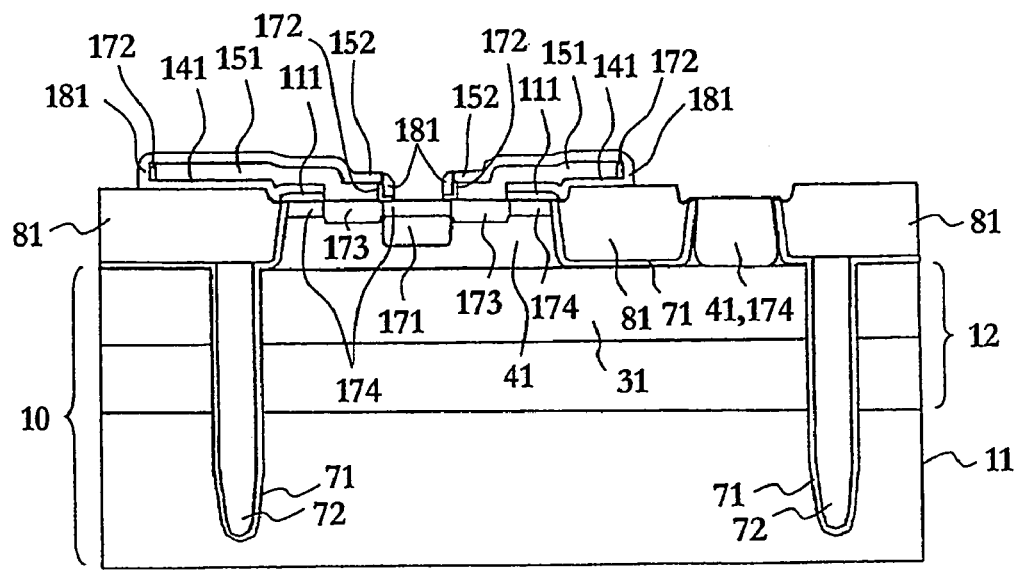

Thereafter, a thermal oxide is grown on exposed silicon surfaces (portions thereof are visible as oxide 111 in FIG. 3).

For the formation of the SiGe mesa transistor an n-type doped low-resistance path from the surface of the wafer to the subcollector 31 is needed. Such a path is formed by photolithographic patterning followed by n-type doping to define a low-resistance collector plug 41, 174 from the upper surface of the structure and down to the subcollector 31. Details of the selection of energy and dose are discussed in WO 9853489, which publication being hereby incorporated by reference. Note that the remaining portion of layer 174 on top of the n-type doped collector plug 41 obtained during etching of the shallow trenches (FIG. 2) achieves an n-type net doping, and the complete collector plug is denoted by 41, 174 in FIG. 3. The oxide layer present on the collector plug 41, 174 is removed.

Subsequently, a thin silicon nitride layer is deposited (remaining portions thereof denoted by 141 in FIG. 3), the purpose of which is to add to the insulator layer 111 deposited in the emitter/base area of the SiGe mesa transistor resulting in lower parasitic capacitance for the base-collector junction; and to serve as an oxidation-resistant mask for the collector plug 41, 174.

Next follow a number of conventional process steps in the fabrication of the SiGe mesa transistor including: (i) formation of an emitter/base opening; (ii) formation of an extrinsic base layer 151; (iii) formation of an oxide layer 152; (iv) formation of an emitter opening within the emitter/base opening; (v) optional formation of a secondary implanted collector 171; (vi) formation of p-type base contact paths 173; (vii) formation of a base oxide 172 in the emitter opening, e.g., by means of depositing a TEOS followed by short densification in an oxidizing environment at 800° C. (hereby a lower temperature budget can be used); and (viii) formation of nitride sidewall spacers 181. In this last step the thin silicon nitride layer 141 is removed except where contributing to spacers 181 and under the extrinsic base layer 151. The resulting structure is shown in FIG. 3.

The actual side-wall spacers can be formed in a two-step process where the nitride 181 first is removed selective to the oxide 172 in the emitter opening, whereupon exposed silicon on the collector plug (remnants of the epi-base) can be removed if necessary. The emitter is protected by the oxide layer 182 during this etch. The remaining oxide 172 in the emitter opening is then removed.

Thereafter, an n-type doped polysilicon layer is formed and subsequently etched to define contact regions 191 and 192 to the emitter and the collector for the SiGe mesa transistor. Note that the oxide layer 152 on top of the p-type polysilicon layer 151 is removed except beneath the emitter contact region 191.

Next, a bi-layer 200, 201 consisting of an oxide and a nitride is deposited on the structure. The structure is then exposed to high temperature to activate and drive-in the previously implanted dopants.

In a preferred embodiment, the heat treatment is performed in nitrogen at about 1050° C. during 5–20 seconds using an RTA (Rapid Thermal Anneal). The purpose of this anneal is to electrically activate the implanted species, and to set the final doping profiles of the emitter-base junction of the SiGe mesa transistor.

Note that the previously deposited silicon oxide 200 and silicon nitride 201 layer remain on the wafer. Their purpose is to stop out-diffusion of the implanted dopants to the surroundings during the heat treatment.

Also note that this heat treatment being the only one in the process flow subsequent to the deposition of the mesa base layer 174, which is performed at a temperature above about 800° C.

Figure 4:
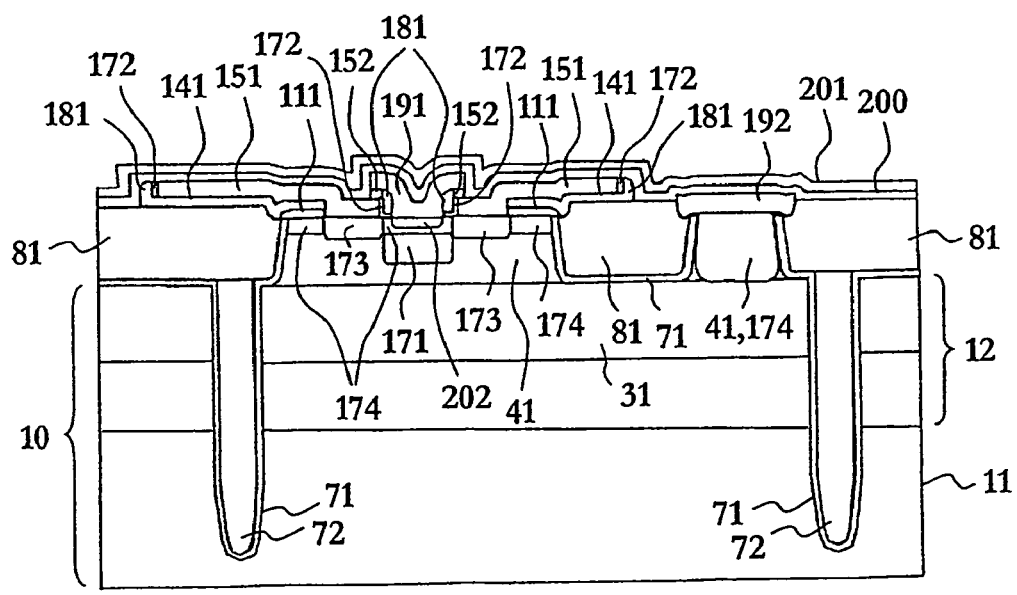

The n-type dopant in the emitter contact 191 will by diffusion penetrate into the base 174 and form the emitter 202. At the same time the p-type dopant of the layer 151 will diffuse into base contact paths 173. The resulting structure is shown in FIG. 4.

Finally, the structure is etched anisotropically, such that outside spacers are formed; exposed silicon surfaces are optionally provided with silicide to reduce the resistance; and passivation and metal layers are formed.

The process flow thus described for the manufacturing of SiGe mesa transistors has a number of advantages.

The critical deposition of the epitaxial base layer (see Table 1) is made blanket on a wafer with a plain silicon upper layer. Other known processes requires either selective epitaxial deposition (on exposed silicon areas only on structures partially covered by masks) with small process windows, which put high requirements on the epitaxial growth, or differential deposition (on silicon and oxide areas), where growth parameters on the different areas may differ.

No separate mesa etch is required since this step is combined with the STI-etch. Simultaneously, with the etching of the mesa base 174, the shallow trenches are formed, and the n-type doped collector region (n-well) and the n-type doped collector plug are defined. Etching the STI down to the buried n+ layer completely isolates the final mesa structure.

The present process flow is easily integrated into existing double-poly process flows.

It will be obvious that the invention may be varied in a plurality of ways. Such variations are not to be regarded as a departure from the scope of the invention. All such modifications as would be obvious to one skilled in the art are intended to be included within the scope of the appended claims.

We claim:

1. A method in the fabrication of a silicon-germanium mesa transistor in a semiconductor process flow, particularly in a process flow designed for a bipolar integrated circuit for radio frequency applications, comprising by the steps of:

providing a p-type doped silicon bulk substrate having an $n^+$-type doped surface region being a subcollector for the mesa transistor;

depositing epitaxially thereon a silicon layer comprising n-type dopant;

depositing epitaxially thereon a silicon layer comprising germanium and p-type dopant;

forming in said n-type and p-type epitaxial layers field isolation areas around, in a horizontal plane, a portion of said epitaxial layers to simultaneously define an n-type doped collector region for the mesa transistor on the subcollector; a p-type doped base region for the mesa transistor thereon; and an n-type doped collector plug on the subcollector, but separated from the n-type doped collector region and the p-type doped base region; and thereafter forming in said p-type doped base region an n-type doped emitter region for the mesa transistor.

2. The method as claimed in claim 1, wherein said field isolation areas are shallow trenches and said shallow trenches are formed and said n-type doped collector region; said p-type doped base region; and said n-type doped collector plug are defined simultaneously by means of a single etching step.

3. The method as claimed in claim 2, wherein etching in said single etching step is performed, in a vertical direction, at least down to said subcollector.

4. The method as claimed in claim 1, wherein said germanium and p-type dopant are added to said silicon layer in-situ during said-epitaxial deposition.

5. The method as claimed in claim 1, wherein said silicon layer comprising germanium and p-type dopant is a multilayer structure.

6. The method as claimed in claim 5, wherein said multilayer structure includes at least one intrinsic silicon layer.

7. The method as claimed in claim 6, wherein said multilayer structure includes at least one silicon-germanium layer between two intrinsic silicon layers.

8. The method as claimed in claim 1, wherein said silicon layer comprising germanium and p-type dopant is deposited by anyone of the techniques RP-CVD, UHV-CVD and MBE.

9. The method as claimed in claim 8, wherein said silicon layer comprising n-type dopant and said silicon layer comprising germanium and p-type dopant are both grown by RP-CVD in a single deposition sequence using the same deposition equipment.

10. The method as claimed in claim 1, wherein carbon is added to said silicon layer comprising germanium and p-type dopant to retard diffusion of said p-type dopant.

11. The method as claimed in claim 1, wherein the temperature during the fabrication of said silicon-germanium mesa transistor is kept below or at about 800° C. subsequent to the deposition of said silicon layer comprising germanium and p-type dopant apart from during a step of emitter activation and drive-in.

12. The method as claimed in claim 11, wherein the step of emitter activation and drive-in is performed using an RTA (Rapid Thermal Anneal) to electrically activate dopants, and to set the final doping profiles of the emitter-base junction of the SiGe mesa transistor.

13. The method as claimed in claim 11, wherein the step of emitter activation and drive-in is performed at high temperature, but during a short time of about 5–20 seconds.

14. The method as claimed in claim 12, wherein the step of emitter activation and drive-in is performed at high temperature, but during a short time of about 5–20 seconds.

15. The method as claimed in claim 1, wherein deep trenches are formed to surround, in a horizontal plane, said n-type doped collector region; said p-type doped base region; and said n-type doped collector plug for isolation of said silicon-germanium mesa transistor.

* * * * *